United States Patent
Haratipour et al.

(10) Patent No.: US 11,769,789 B2
(45) Date of Patent: Sep. 26, 2023

(54) MFM CAPACITOR WITH MULTILAYERED OXIDES AND METALS AND PROCESSES FOR FORMING SUCH

(71) Applicant: Intel Corporation, Santa Clara, CA (US)

(72) Inventors: Nazila Haratipour, Hillsboro, OR (US); Chia-Ching Lin, Portland, OR (US); Sou-Chi Chang, Portland, OR (US); Ashish Verma Penumatcha, Hillsboro, OR (US); Owen Loh, Portland, OR (US); Mengcheng Lu, Portland, OR (US); Seung Hoon Sung, Portland, OR (US); Ian A. Young, Portland, OR (US); Uygar Avci, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1032 days.

(21) Appl. No.: 16/368,450

(22) Filed: Mar. 28, 2019

(65) Prior Publication Data

US 2020/0312949 A1 Oct. 1, 2020

(51) Int. Cl.
*H01G 4/30* (2006.01)
*H10B 51/00* (2023.01)
*H01L 23/522* (2006.01)
*H01L 49/02* (2006.01)
*H01G 4/012* (2006.01)

(52) U.S. Cl.
CPC .............. *H01L 28/56* (2013.01); *H01G 4/012* (2013.01); *H01G 4/30* (2013.01); *H01L 23/5226* (2013.01); *H10B 51/00* (2023.02)

(58) Field of Classification Search
CPC ................. H01L 28/56; H01L 23/5226; H01L 27/11585; H01L 28/57; H01G 4/012; H01G 4/30; H10B 51/00
See application file for complete search history.

(56) References Cited

U.S. PATENT DOCUMENTS

| 6,429,088 | B1 | 8/2002 | Lau | |
| 6,603,161 | B2 * | 8/2003 | Kanaya | H10B 53/00 257/295 |
| 7,910,967 | B2 * | 3/2011 | Shin | H10B 53/30 257/295 |

(Continued)

FOREIGN PATENT DOCUMENTS

| EP | 0911871 | 4/1999 |
| EP | 1087426 A2 | 3/2001 |

OTHER PUBLICATIONS

Search Report from European Patent Application No. 20163971.3, dated Aug. 28, 2020, 9 pgs.

*Primary Examiner* — David Vu
*Assistant Examiner* — Brandon C Fox
(74) *Attorney, Agent, or Firm* — Schwabe, Williamson & Wyatt P.C.

(57) ABSTRACT

A capacitor is disclosed. The capacitor includes a first metal layer, a second metal layer on the first metal layer, a ferroelectric layer on the second metal layer, and a third metal layer on the ferroelectric layer. The second metal layer includes a first non-reactive barrier metal and the third metal layer includes a second non-reactive barrier metal. A fourth metal layer is on the third metal layer.

24 Claims, 9 Drawing Sheets

(56) References Cited

U.S. PATENT DOCUMENTS

| | | | |
|---|---|---|---|
| 10,282,108 B2* | 5/2019 | Ryan | G06F 3/0611 |
| 11,088,154 B1* | 8/2021 | Yeong | H01L 29/66795 |
| 2002/0153550 A1* | 10/2002 | An | H01L 28/65 |
| | | | 257/296 |
| 2003/0141527 A1 | 7/2003 | Joo | |
| 2004/0169255 A1 | 9/2004 | Kiyotoshi | |
| 2015/0311217 A1* | 10/2015 | Chavan | H10B 53/30 |
| | | | 257/295 |
| 2019/0074295 A1* | 3/2019 | Schröder | H01L 28/40 |
| 2020/0006346 A1* | 1/2020 | Avci | H01L 28/90 |
| 2022/0285373 A1* | 9/2022 | Chen | H01L 29/78391 |
| 2022/0310635 A1* | 9/2022 | Trinh | H01L 28/60 |

* cited by examiner

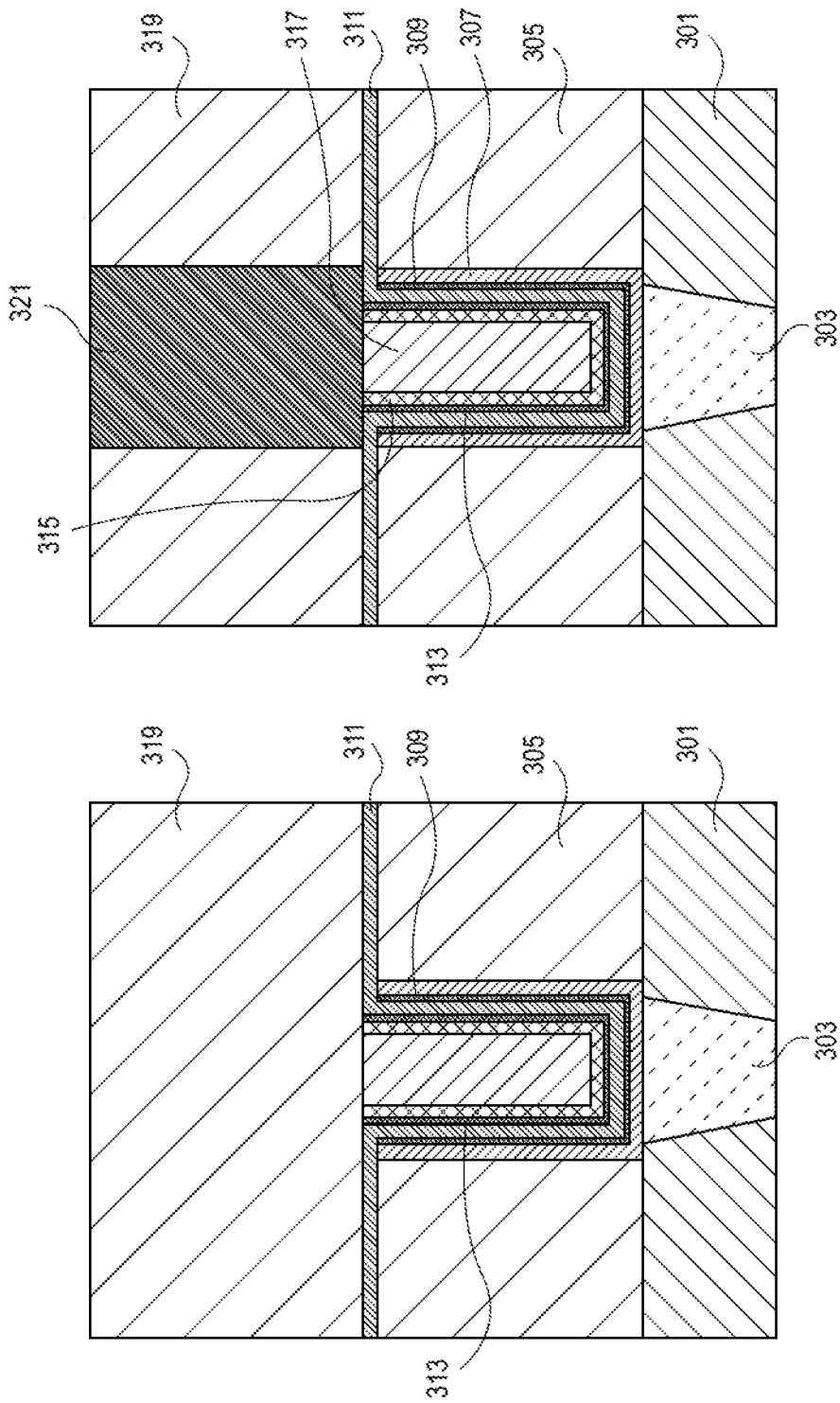

US 11,769,789 B2

1

MFM CAPACITOR WITH MULTILAYERED OXIDES AND METALS AND PROCESSES FOR FORMING SUCH

TECHNICAL FIELD

Embodiments of the disclosure pertain to metal-ferroelectric-metal (MFM) capacitors and, in particular, to MFM capacitors with multilayered oxides and metals and processes for forming such.

BACKGROUND

Metal-ferroelectric-metal (MFM) capacitors and ferroelectric memories include stacked metal, ferroelectric and metal layers. Oxidation at metal/ferroelectric interfaces degrades the reliability of these devices. The degradation of the reliability of these devices can be caused by the creation of oxygen vacancies in the ferroelectric oxide as well as unwanted oxide at the metal/ferroelectric interface. Reactive metals at the metal/ferroelectric interface can enhance this effect. When an excessive number of oxygen vacancies are created in the ferroelectric oxide, breakdown or ferroelectric fatigue can occur which can cause a loss of switchable polarization.

BRIEF DESCRIPTION OF THE DRAWINGS

FIGS. 3A-3H illustrate cross-sections of an MFM capacitor structure with multilayer metals during a process of fabricating the MFM capacitor according to an embodiment.

DESCRIPTION OF THE EMBODIMENTS

Figure 1:
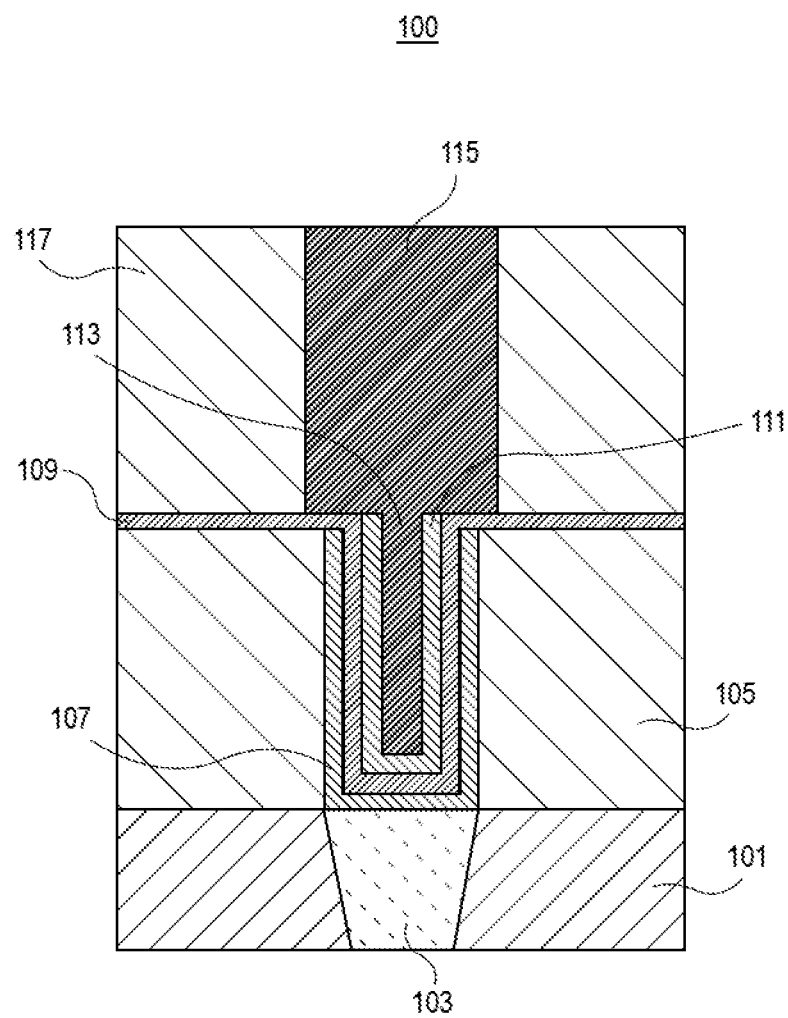
FIG. 1 illustrates a metal-ferroelectric-metal (MFM) capacitor with multilayer metals of a previous approach.

A metal-ferroelectric-metal (MFM) capacitor with multilayer metals is described. It should be appreciated that although embodiments are described herein with reference to example MFM capacitors with multilayer metals implementations, the disclosure is more generally applicable to MFM capacitors with multilayer metals implementations as well as other type MFM capacitors with multilayer metals implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as

2

"upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Metal-ferroelectric-metal (MFM) capacitors and ferroelectric memories include stacked metal, ferroelectric and metal layers. Oxidation at metal/ferroelectric interfaces of the MFM capacitors degrades the reliability of these devices. The degradation of the reliability of these devices is caused by the creation of oxygen vacancies in their ferroelectric film as well as unwanted oxide at the metal/ferroelectric interfaces. In particular, reactive metals at metal/ferroelectric interfaces can enhance this effect. It should be appreciated that when an excessive number of oxygen vacancies are created in the ferroelectric film breakdown can occur.

An approach that addresses the shortcomings of previous approaches is disclosed and described herein. For example, as part of a disclosed process, thin non-reactive metal barriers can be used at the metal/ferroelectric interfaces to prevent oxidation at the metal/ferroelectric interfaces. In an embodiment, using thin non-reactive metal barriers at the metal/ferroelectric interfaces suppresses oxygen vacancy creation in the ferroelectric film.

FIG. 1 shows an MFM capacitor 100 with multilayer oxides and metals of a previous approach. In FIG. 1, the MFM capacitor 100 includes dielectric layer 101, metal via 103, dielectric layer 105, conformal bottom electrode metal 107, ferroelectric layer 109, metal 111, metal fill 113, connector metal 115, and dielectric layer 117.

Referring to FIG. 1, a space in the dielectric layer 101 is filled with metal to form metal via 103. Dielectric layer 105 includes a trench that is lined with conformal bottom electrode metal 107. In particular, the conformal bottom electrode metal 107 covers the bottom and sidewalls of the trench. The ferroelectric layer 109 covers the portions of the conformal bottom electrode metal 107 that cover the bottom and sidewalls of the trench. The ferroelectric metal extends outside of the trench and covers the top surface of the dielectric layer 105 on first and second sides of the trench. The dielectric layer 117 is formed above the portions of the ferroelectric layer 109 that cover the top surface of the dielectric layer 105. As shown in FIG. 1, the dielectric layer 117 includes a space in which the connector metal 115 is formed.

In operation, the capacitor can be charged and discharged as a part of memory operations. The polarity of the charge on the plates of the capacitor is used to set the polarization state or direction of the ferroelectric layer 109 (e.g., ferroelectric film). A parameter that is used to characterize a capacitor's performance is endurance. Endurance is a reliability measure. The endurance of a capacitor relates to the maximum number of cycles that the capacitor can tolerate and indicates the capability of the capacitor to continue to work as expected as a function of time. A degradation of the reliability of the MFM capacitor 100 is caused by the movement of oxygen vacancies in the ferroelectric layer 109 and by the formation of unwanted oxide at metal/ferroelectric interfaces (e.g., interfaces between metal layer 107 and ferroelectric layer 109 and ferroelectric layer 109 and metal layer 111). Reactive metals such as (but not limited to) TiN and TaN at these interfaces create oxygen vacancies in the ferroelectric layer 109. Excessive oxygen vacancies impact endurance by degrading the ferroelectric layer 109 and enhancing fatigue. As such, the creation of oxygen vacancies in the ferroelectric layer 109 negatively impacts the maximum number of cycles that the MFM capacitor 100 can tolerate. Thus, the reliability of the MFM capacitor 100 of the approach illustrated in FIG. 1 can suffer.

Figure 2:
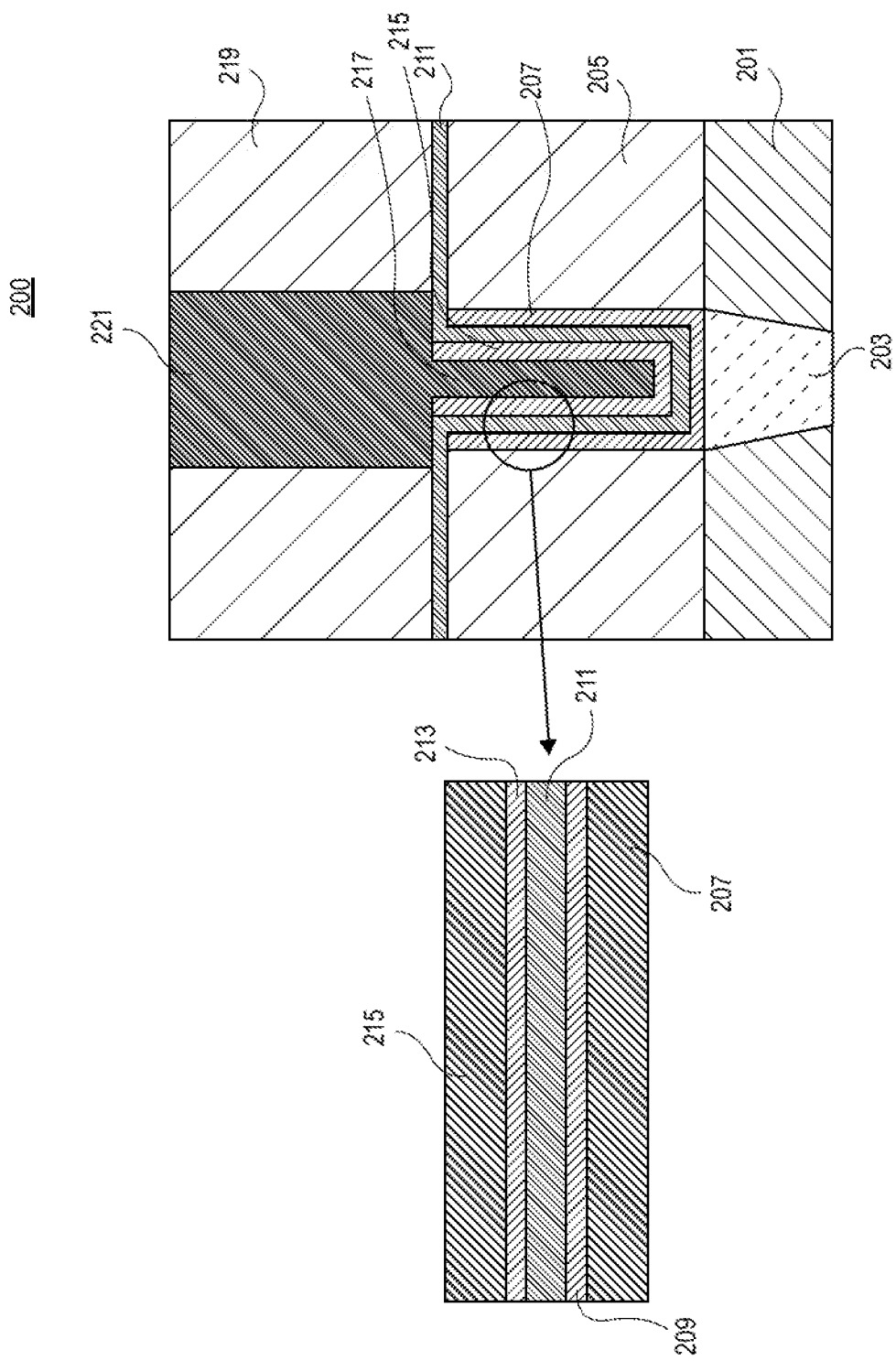
FIG. 2 illustrates an MFM capacitor with multilayer metals according to an embodiment.

FIG. 2 illustrates an MFM capacitor 200 with multilayer oxides and metals according to an embodiment. In FIG. 2, the MFM capacitor 200 includes dielectric layer 201, metal via 203, dielectric layer 205, metal 207, non-reactive barrier metal 209 (in expanded view at left), ferroelectric layer 211, non-reactive barrier metal 213 (in expanded view at left), metal 215, metal fill 217, dielectric layer 219 and connector metal 221.

Referring to FIG. 2, dielectric layer 201 includes a via that is filled to form metal via 203. Dielectric layer 205 includes a trench that is lined with metal 207. For example, the metal 207 covers the bottom and sidewalls of the trench. The non-reactive barrier metal 209 covers the bottom and the sidewalls of the metal 207. The ferroelectric layer 211 covers the portions of the non-reactive barrier metal 209 that covers the bottom and sidewalls of the trench. The ferroelectric layer 211 extends outside the trench and covers the top surfaces of portions of the dielectric layer 205 on the right side and the left side of the trench. The non-reactive barrier metal 213 covers the bottom and sidewalls of the ferroelectric layer 211. The metal 215 covers the bottom and sidewalls of the non-reactive barrier metal 213. The dielectric layer 219 is formed above portions of the ferroelectric layer 211 that cover the top surfaces of the dielectric layer 205. The dielectric layer 219 includes a space in which connector metal 221 is formed.

In an embodiment, the dielectric layer 201 can be formed from oxide, nitride, carbon doped oxide or carbon doped nitride. In other embodiments, the dielectric layer 201 can be formed from any other type of dielectric material. In an embodiment, the metal via 203 can be formed from tungsten, cobalt, copper or copper with a TaN liner. In other embodiments, the metal via 203 can be formed from other materials. In an embodiment, the dielectric layer 205 can be formed from oxide. In other embodiments, the dielectric layer 205 can be formed from other types of dielectric material. In an embodiment, the metal 207 and the metal 215 can be formed from ALD or CVD metals, titanium nitride, tantalum nitride, ruthenium, ruthenium oxide, iridium oxide or titanium silicon oxide. In other embodiments, the metal 207 and the metal 215 can be formed from other materials. In an embodiment, the non-reactive barrier metal 209 and the non-reactive barrier metal 213 can be formed from tantalum nitride, ruthenium, ruthenium oxide, iridium or iridium oxide. In other embodiments, the non-reactive barrier metal 209 and the non-reactive barrier metal 213 can be formed from other types of oxygen diffusion barrier metals. In an embodiment, the ferroelectric material 211 can be formed from hafnium zirconium oxide, hafnium oxide, zirconium oxide, aluminum doped hafnium oxide, silicon doped hafnium oxide, yttrium doped hafnium oxide, lanthanum doped hafnium oxide, lanthanum doped zirconium oxide, or lead zirconate titanate (PZT). In other embodiments, the ferroelectric material 211 can be formed from other types of materials. In an embodiment, the metal fill 217 can be formed from tungsten, cobalt or copper. In other embodiments, the metal fill 217 can be formed from other materials. In an embodiment, the dielectric layer 219 can be formed from oxide. In other embodiments, the dielectric layer 219 can be formed from other types of dielectric materials. In an embodiment, the connector metal 221 can be formed from tungsten, cobalt or copper. In other embodiments, the connector metal 221 can be formed from other materials.

In operation, the memory state of the MFM capacitor 200 is defined by the polarization charge stored in the capacitor. Having excessive trap states in the ferroelectric can increase charge trapping during ferroelectric switching. Utilizing the non-reactive barrier metal 209 and the non-reactive barrier metal 213 prevents the creation of oxygen vacancy traps in the ferroelectric layer 211. In an embodiment, because the non-reactive barrier metal 209 and the non-reactive barrier metal 213 prevents the creation of oxygen vacancies in the ferroelectric layer 211 they prevent the breakdown of the ferroelectric layer 211 and the degradation of the reliability of the MFM capacitor 200.

Figure 3A:
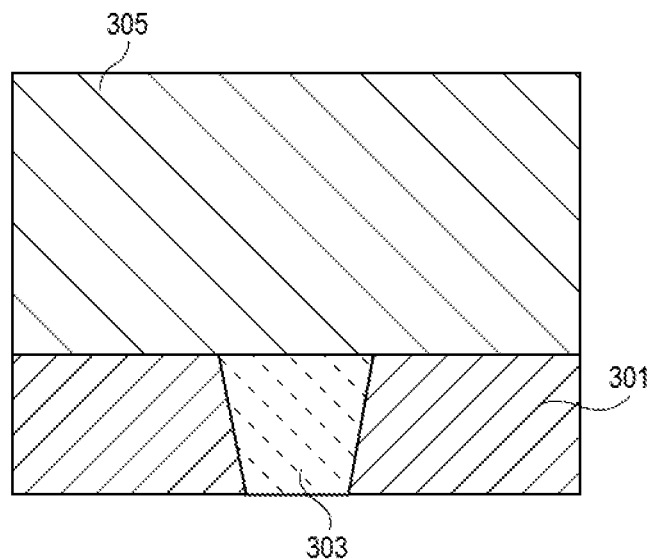

FIGS. 3A-3H shows cross-sections of a MFM capacitor that includes multilayer metals during the fabrication of the MFM capacitor according to an embodiment. Referring to FIG. 3A, after a plurality of operations a structure is formed that includes dielectric layer 301, metal via 303 and a dielectric layer 305.

Figure 3B:
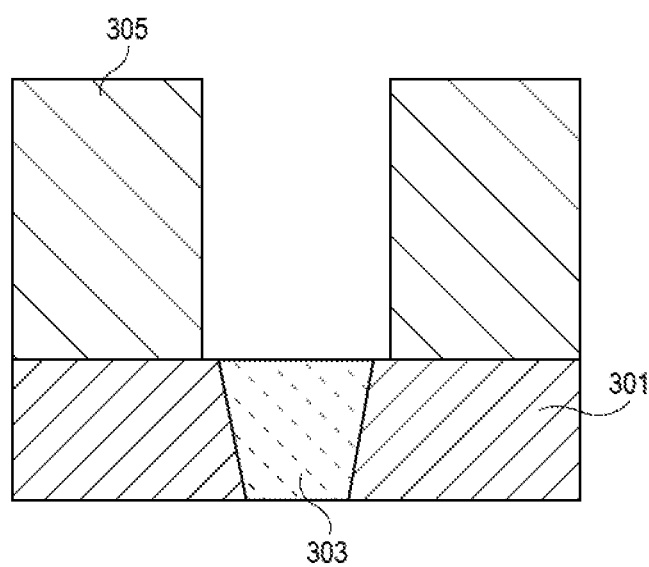

Referring to FIG. 3B, subsequent to one or more operations that result in a cross-section of the structure shown in FIG. 3A, a space is formed in the dielectric layer 305. In an embodiment, the space can be formed by removal of dielectric material from the dielectric layer 305. In an embodiment, the removal of dielectric material can be performed by etching. In an embodiment, the etching can be performed by dry etch or wet etching. In other embodiments, other manner of removing the dielectric material can be used.

Figure 3C:
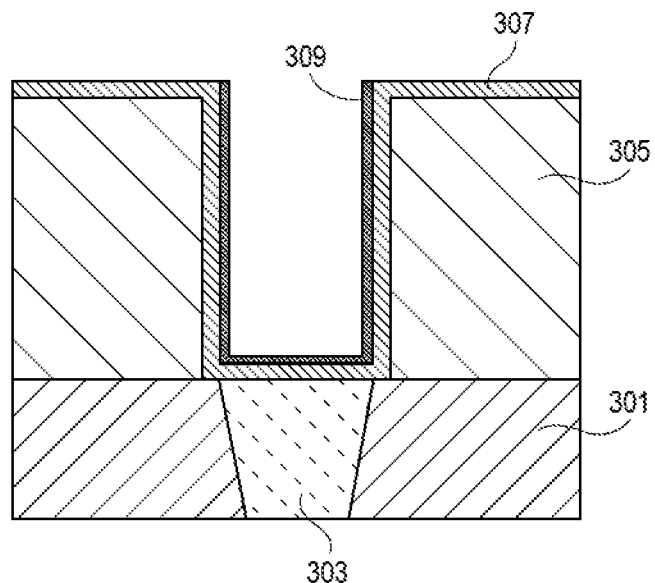

Referring to FIG. 3C, subsequent to one or more operations that result in the cross-section shown in FIG. 3B, a metal layer 307 is formed on the trench bottom and sidewalls and above the top surface of dielectric layer 305. In addition, a non-reactive barrier metal 309 is formed on the bottom and sidewalls of the metal layer 307. In an embodiment, the metal layer 307 can be formed by atomic layer deposition (ALD), physical vapor deposition (PVD), chemical vapor deposition (CVD), electrochemical deposition (ECD), or molecular beam epitaxy (MBE). In other embodiments, the metal layer 307 can be formed in other manners. In an embodiment, the non-reactive barrier metal layer 309 can be formed by atomic layer deposition (ALD), physical vapor deposition (PVD), chemical vapor deposition (CVD), electrochemical deposition (ECD), or molecular beam epitaxy (MBE). In other embodiments, the non-reactive barrier metal layer 309 can be formed in other manners.

Figure 3D:
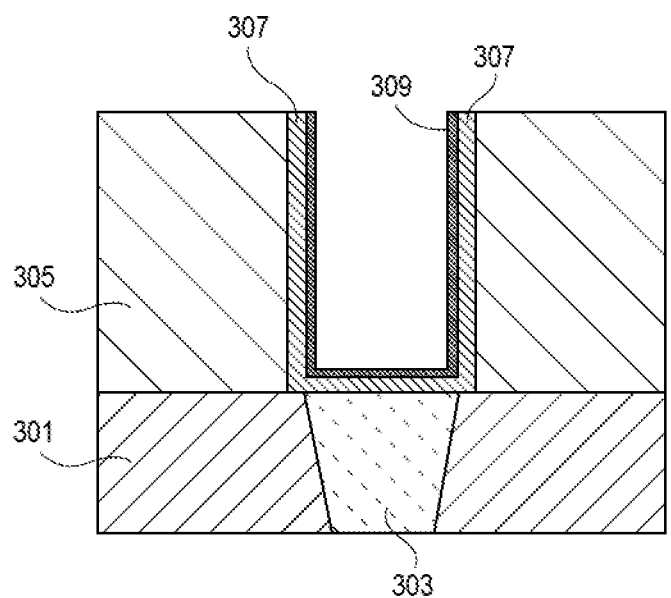

Referring to FIG. 3D, subsequent to one or more operations that result in a cross-section shown in FIG. 3C, the portion of the metal layer 307 that is formed above the top surface of the dielectric layer 305 is removed. In an embodiment, the portion of metal layer 307 that is formed above the top surface of the dielectric layer 305 can be removed by etching. In other embodiments, the portion of the metal layer 307 that is formed above the top surface of the dielectric layer 305 can be removed in other manners.

Figure 3E:
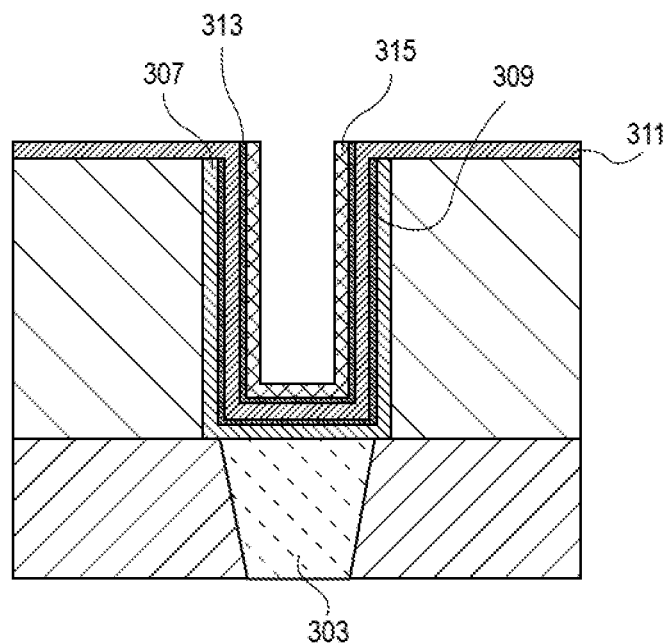

Referring to FIG. 3E, subsequent to one or more operations that result in a cross-section shown in FIG. 3D, a ferroelectric layer 311 is formed on the non-reactive barrier metal 309, a non-reactive barrier metal 313 is formed on the ferroelectric layer 311 and a metal layer 315 is formed on the non-reactive barrier metal 313. In an embodiment, the ferroelectric layer 311 can be formed by atomic layer deposition (ALD) or sputtering. In other embodiments, the ferroelectric layer 311 can be formed by physical vapor deposition (PVD), chemical vapor deposition (CVD), electrochemical deposition (ECD), or molecular beam epitaxy (MBE). In still other embodiments, the ferroelectric layer 311 can be formed in other manners. In an embodiment, the non-reactive barrier metal layer 313 can be formed by atomic layer deposition (ALD). In other embodiments, the non-reactive barrier metal layer 313 can be formed by physical vapor deposition (PVD), chemical vapor deposition (CVD), electrochemical deposition (ECD), or molecular beam epitaxy (MBE). In still other embodiments, the non-reactive barrier metal layer 313 can be formed in other manners.

Figure 3F:
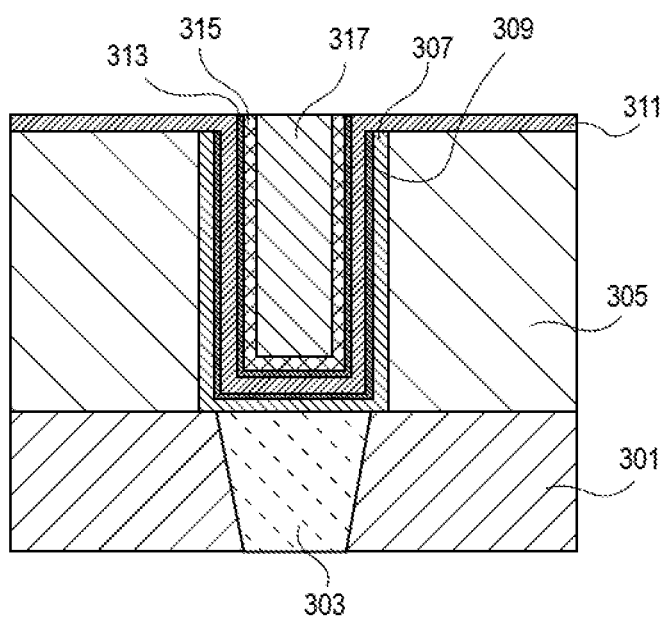

Referring to FIG. 3F, subsequent to one or more operations that result in the cross-section shown in FIG. 3E, a metal fill 317 is formed in a space defined by the metal layer 315. In an embodiment, the metal fill 317 can be formed by atomic layer deposition (ALD), physical vapor deposition (PVD), chemical vapor deposition (CVD), electrochemical deposition (ECD), or molecular beam epitaxy (MBE)). In other embodiments, the metal fill 317 can be formed in other manners.

Referring to FIG. 3G, subsequent to one or more operations that result in the cross-section shown in FIG. 3F, a dielectric layer 319 is formed above the top surface of the MFM structure. In an embodiment, the dielectric layer 319 can be formed by physical vapor deposition (PVD), chemical vapor deposition (CVD), electrochemical deposition (ECD), molecular beam epitaxy (MBE) or atomic layer deposition (ALD). In other embodiments, the dielectric layer 319 can be formed in other manners.

Referring to FIG. 3H, after one or more operations that result in the cross-section shown in FIG. 3G, an opening is formed in the dielectric layer 319 and a connector metal 321 is formed in the opening. In an embodiment, the connector metal 321 can be formed by atomic layer deposition (ALD), physical vapor deposition (PVD), chemical vapor deposition (CVD), electrochemical deposition (ECD), or molecular beam epitaxy (MBE). In other embodiments, the connector metal 321 can be formed in other manners.

Figure 4:
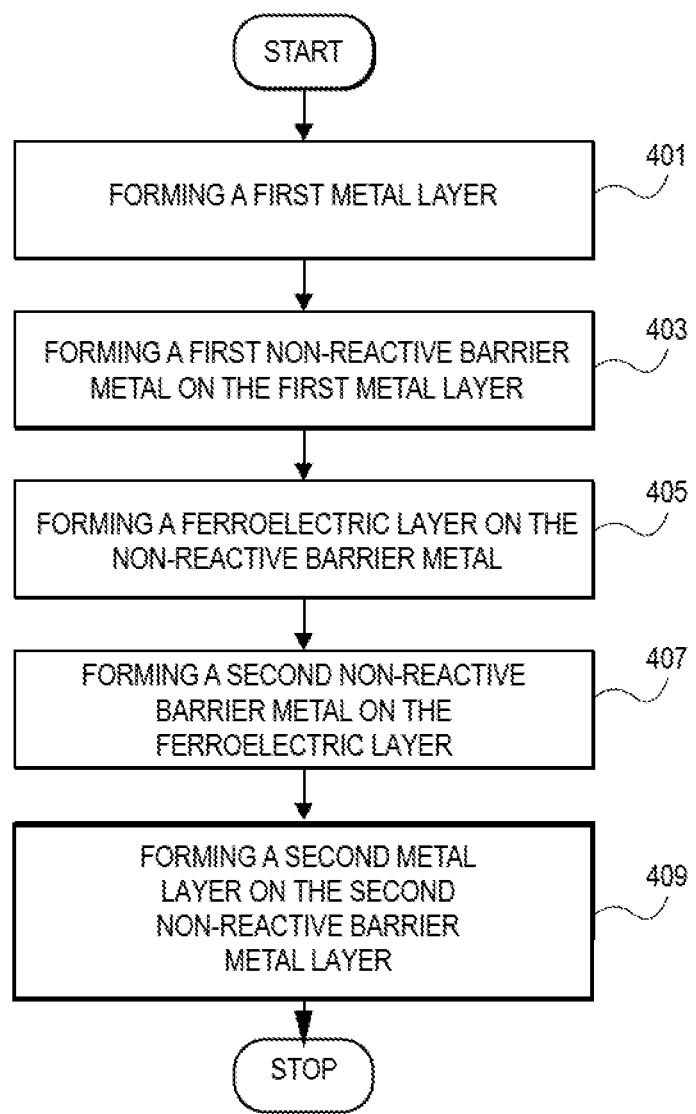
FIG. 4 illustrates a flowchart of a process for fabricating the MFM capacitor with multilayer metals according to an embodiment.

FIG. 4 is a flowchart of a method for forming an MFM capacitor with multilayer metals of an embodiment. Referring to FIG. 4, the method includes, at 401 forming a first metal layer. At 403, forming a first non-reactive barrier metal layer on the first metal layer. At 405, forming a ferroelectric layer on the first non-reactive barrier metal layer. At 407, forming a second non-reactive barrier metal layer on the ferroelectric layer. At 409, forming a second metal layer on the second non-reactive barrier metal layer.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
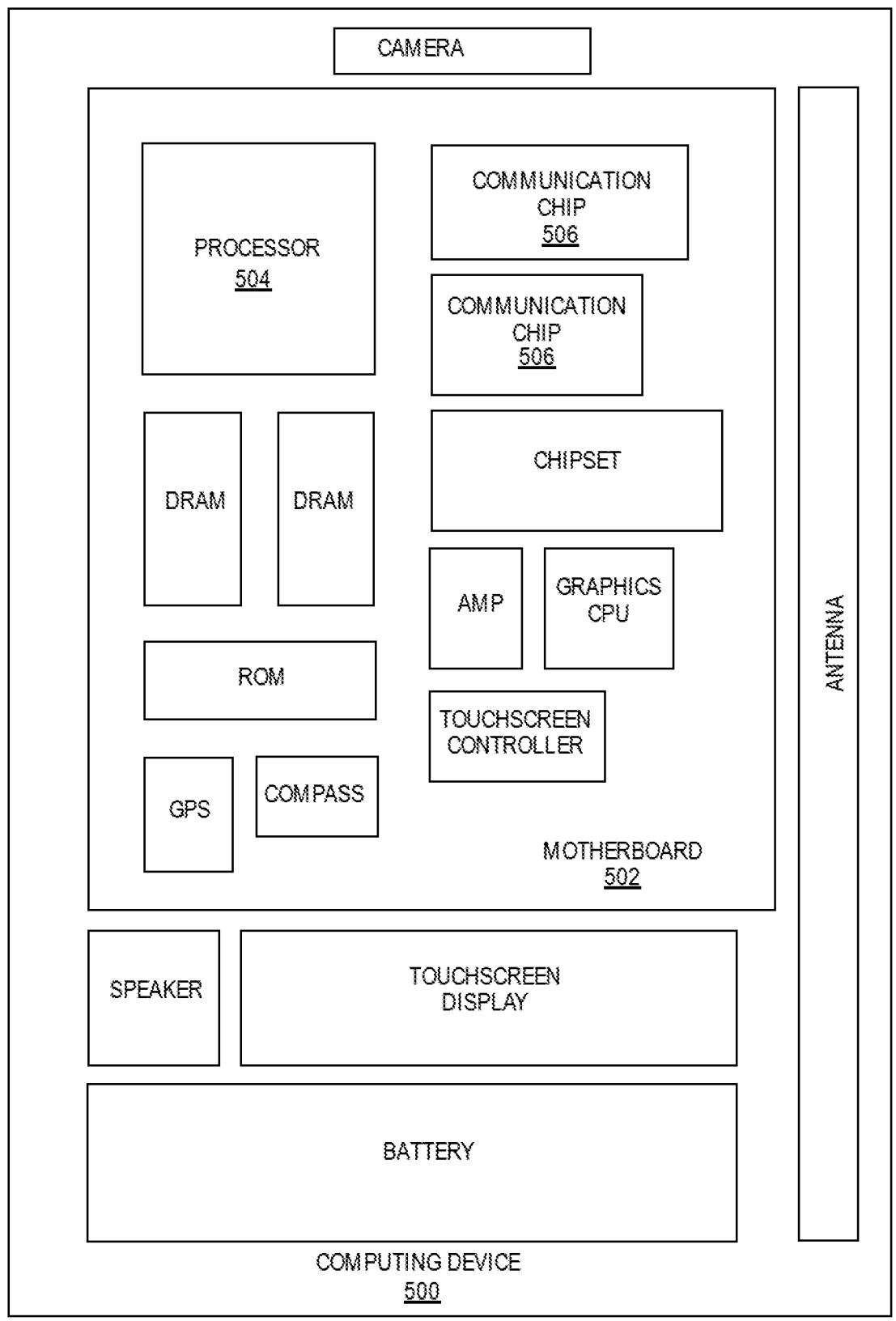
FIG. 5 illustrates a computing device in accordance with one implementation of an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, memory and or logic systems of computing device 500 (such as but not limited to DRAM and/or DRAM that is embedded in logic) can include capacitors such as capacitor 200 described herein with reference to FIG. 2.

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
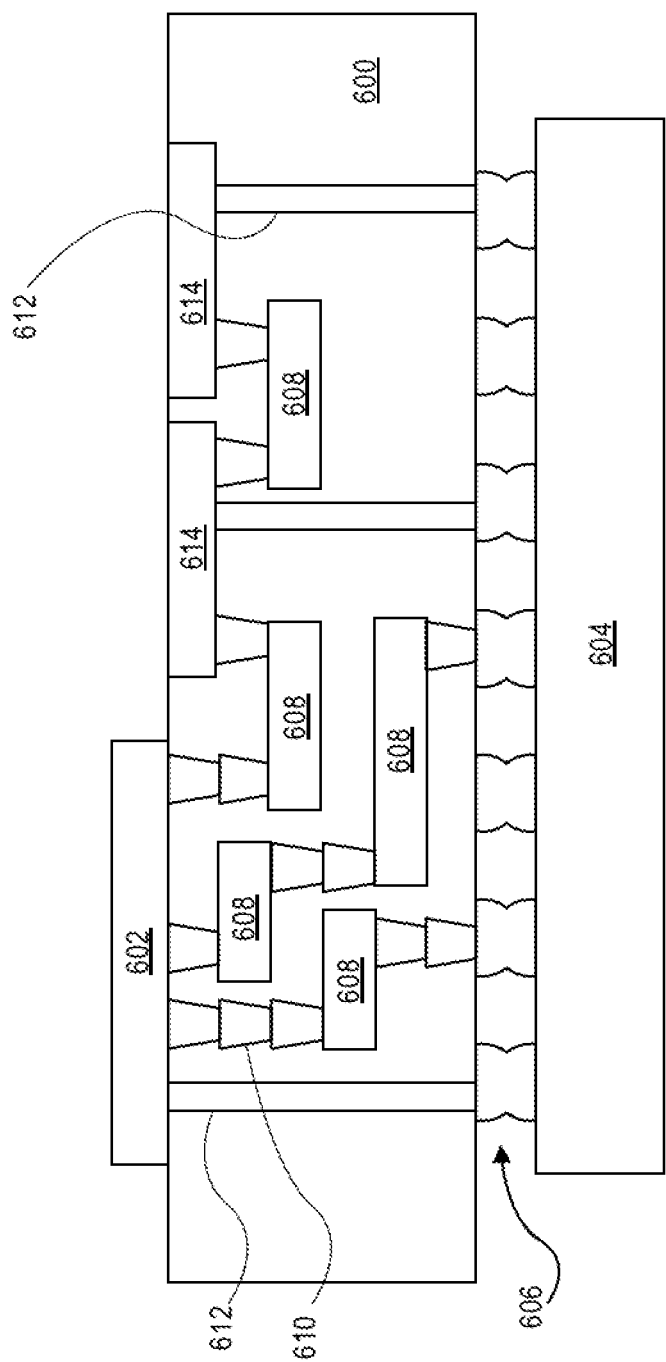
FIG. 6 illustrates an interposer that includes one or more embodiments.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer 600 may be formed of alternate rigid or flexible materials that may include the same materials described above for use in a semiconductor substrate, such as silicon, germanium, and other group III-V and group IV materials.

The interposer 600 may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A capacitor includes a first metal layer, a second metal layer on the first metal layer, the second metal layer including a first non-reactive barrier metal, a ferroelectric layer on the second metal layer, a third metal layer on the ferroelectric layer, the third metal layer including a second non-reactive barrier metal; and a fourth metal layer on the third metal layer.

Example Embodiment 2

The capacitor of example embodiment 1, further comprising a metal via in a first dielectric layer.

Example Embodiment 3

The capacitor of example embodiment 2, wherein the first metal layer is in a space in a second dielectric layer.

Example Embodiment 4

The capacitor of example embodiment 1, 2, or 3, further comprising a metal fill in a space that is defined by the fourth metal layer.

Example Embodiment 5

The capacitor of example embodiment 3, or 4, further comprising a third dielectric layer above a top surface of the ferroelectric layer.

Example Embodiment 6

The capacitor of example embodiment 1, 2, 3, 4, or 5 wherein the ferroelectric layer includes a ferroelectric oxide.

Example Embodiment 7

The capacitor of example embodiment 5, or 6 further comprising a connector metal in a space in the third dielectric layer.

Example Embodiment 8

A capacitor including an intermediate dielectric layer, a first metal layer in a space in the intermediate dielectric layer, a second metal layer on the first metal layer, the second metal layer including a first non-reactive barrier metal, a ferroelectric layer on the second metal layer and extending onto a top surface of the intermediate dielectric layer, a third metal layer on the ferroelectric layer, the third metal layer including a second non-reactive barrier metal, a fourth metal layer on the third metal layer, and a top dielectric layer above an upper surface of the ferroelectric layer, and a bottom dielectric layer below the intermediate dielectric layer.

Example Embodiment 9

The capacitor of example embodiment 8, wherein the ferroelectric layer extends onto a top surface of the intermediate layer.

Example Embodiment 10

The capacitor of example embodiment 8 or 9, further comprising a metal via underneath the first metal layer.

Example Embodiment 11

The capacitor of example embodiment 8, 9, or 10 further comprising a metal fill in a space that is defined by the fourth metal layer.

Example Embodiment 12

The capacitor of example embodiment 8, 9, 10, or 11 wherein the ferroelectric layer includes a ferroelectric oxide.

Example Embodiment 13

The capacitor of example embodiment 8, 9, 10, 11, or 12, further comprising a connector metal in a space in the top dielectric layer.

Example Embodiment 14

A system including one or more processing components, and one or more data storage components, the data storage components including at least one capacitor, the at least one capacitor including a first metal layer, a second metal layer on the first metal layer, the second metal layer including a first non-reactive barrier metal, a ferroelectric layer on the second metal layer, a third metal layer on the ferroelectric layer, the third metal layer including a second non-reactive barrier metal, and a fourth metal layer on the third metal layer.

Example Embodiment 15

The system of example embodiment 14, further comprising a metal via in a first dielectric layer.

Example Embodiment 16

The system of example embodiment 15, wherein the first metal layer is in a space in a second dielectric layer.

Example Embodiment 17

The system of example embodiment 14, 15, or 16, further comprising a metal fill in a space that is defined by the fourth metal layer.

Example Embodiment 18

The system of example embodiment 16, or 17, further comprising a third dielectric layer above a top surface of the ferroelectric layer.

Example Embodiment 19

The system of example embodiment 14, 15, 16, 17, or 18, wherein the ferroelectric layer includes a ferroelectric oxide.

Example Embodiment 20

The system of example embodiment 18, or 19, further comprising a connector metal in a space in the third dielectric layer.

Example Embodiment 21

A method including forming a first dielectric layer, forming a metal via in the first dielectric layer, forming a second dielectric layer, forming a first space in the second dielectric layer, forming a first metal layer in the first space, forming a first non-reactive barrier layer on the first metal layer, forming a ferroelectric layer on the first non-reactive barrier layer, forming a second non-reactive barrier layer on the ferroelectric layer; and forming a second metal layer on the second non-reactive barrier layer.

Example Embodiment 22

The method of example embodiment 21, wherein the forming the ferroelectric layer includes forming the ferroelectric layer to extend onto a surface of the second dielectric layer.

Example Embodiment 23

The method of example embodiment 21 or 22, further comprising forming a metal fill in a space formed by the second metal layer.

Example Embodiment 24

The method of example embodiment 21, 22, or 23, further comprising forming a third dielectric layer above the second dielectric layer.

Example Embodiment 25

The method of example embodiment 24, further comprising forming a space in the third dielectric layer and forming a connector metal in the space in the third dielectric layer.

Example Embodiment 26

A method, including forming a first metal layer, forming a first non-reactive barrier metal layer on the first metal layer, forming a ferroelectric layer on the first non-reactive barrier metal layer, forming a second non-reactive barrier metal layer on the ferroelectric layer, and forming a second metal layer on the second non-reactive barrier metal layer.

Example Embodiment 27

The method of example embodiment 26, further comprising forming a metal via in a first dielectric layer.

Example Embodiment 28

The method of example embodiment 27, further comprising a second dielectric layer, wherein the first metal layer is formed in a space in the second dielectric layer.

Example Embodiment 29

The method of example embodiment 26, 27, or 28, further comprising forming a metal fill in a space that is defined by the second metal layer.

Example Embodiment 30

The method of example embodiment 28 or 29, further comprising forming a third dielectric layer above a top surface of the ferroelectric layer.

Example Embodiment 31

The method of example embodiment 26, 27, 28, 29, or 30, wherein the ferroelectric layer includes ferroelectric oxide.

Example Embodiment 32

The method of example embodiment 26, 27, 28, 29, 30, or 31 further comprising forming a connector metal in a space formed in a third dielectric layer.

What is claimed is:

1. A capacitor, comprising:
   a first metal layer;
   a second metal layer on the first metal layer, the second metal layer including a first non-reactive barrier metal;
   a ferroelectric layer on the second metal layer;
   a third metal layer on the ferroelectric layer, the third metal layer including a second non-reactive barrier metal; and
   a fourth metal layer on the third metal layer, wherein the ferroelectric layer extends laterally beyond the third metal layer and the fourth metal layer, and wherein the ferroelectric layer has an uppermost surface at a same level as an uppermost surface of the third metal layer and the fourth metal layer.

2. The capacitor of claim 1, further comprising a metal via in a first dielectric layer.

3. The capacitor of claim 2, wherein the first metal layer is in a space in a second dielectric layer.

4. The capacitor of claim 3, further comprising a third dielectric layer above a top surface of the ferroelectric layer.

5. The capacitor of claim 4, further comprising a connector metal in a space in the third dielectric layer.

6. The capacitor of claim 1, further comprising a metal fill in a space that is defined by the fourth metal layer.

7. The capacitor of claim 1, wherein the ferroelectric layer includes ferroelectric oxide.

8. A capacitor, comprising:
   an intermediate dielectric layer;
   a first metal layer in a space in the intermediate dielectric layer;
   a second metal layer on the first metal layer, the second metal layer including a first non-reactive barrier metal;
   a ferroelectric layer on the second metal layer and extending onto a top surface of the intermediate dielectric layer;
   a third metal layer on the ferroelectric layer, the third metal layer including a second non-reactive barrier metal;
   a fourth metal layer on the third metal layer, wherein the ferroelectric layer extends laterally beyond the third metal layer and the fourth metal layer, and wherein the ferroelectric layer has an uppermost surface at a same level as an uppermost surface of the third metal layer and the fourth metal layer; and
   a top dielectric layer above an upper surface of the ferroelectric layer and a bottom dielectric layer below the intermediate dielectric layer.

9. The capacitor of claim 8, further comprising a metal via underneath the first metal layer.

10. The capacitor of claim 8, further comprising a metal fill in a space that is defined by the fourth metal layer.

11. The capacitor of claim 8, wherein the ferroelectric layer includes a ferroelectric oxide.

12. The capacitor of claim 8, further comprising a connector metal in a space in the top dielectric layer.

13. A system, comprising:
    one or more processing components; and
    one or more data storage components, the data storage components including at least one capacitor, the at least one capacitor including:
    a first metal layer;
    a second metal layer on the first metal layer, the second metal layer including a first non-reactive barrier metal;
    a ferroelectric layer on the second metal layer;
    a third metal layer on the ferroelectric layer, the third metal layer including a second non-reactive barrier metal; and
    a fourth metal layer on the third metal layer, wherein the ferroelectric layer extends laterally beyond the third metal layer and the fourth metal layer, and wherein the ferroelectric layer has an uppermost surface at a same level as an uppermost surface of the third metal layer and the fourth metal layer.

14. The system of claim 13, further comprising a metal via in a first dielectric layer.

15. The system of claim 14, wherein the first metal layer is in a space in a second dielectric layer.

16. The system of claim 15, further comprising a third dielectric layer above a top surface of the ferroelectric layer.

17. The system of claim 16, further comprising a connector metal in a space in the third dielectric layer.

18. The system of claim 13, further comprising a metal fill in a space that is defined by the fourth metal layer.

19. The system of claim 13, wherein the ferroelectric layer includes a ferroelectric oxide.

20. A method, comprising:
    forming a first dielectric layer;
    forming a metal via in the first dielectric layer;
    forming a second dielectric layer;
    forming a first space in the second dielectric layer;
    forming a first metal layer in the first space;
    forming a first non-reactive barrier layer on the first metal layer;
    forming a ferroelectric layer on the first non-reactive barrier layer;
    forming a second non-reactive barrier layer on the ferroelectric layer; and
    forming a second metal layer on the second non-reactive barrier layer, wherein the ferroelectric layer extends laterally beyond the second non-reactive barrier layer and the second metal layer, and wherein the ferroelectric layer has an uppermost surface at a same level as an uppermost surface of the second non-reactive barrier layer and the second metal layer.

21. The method of claim 20, wherein the forming the ferroelectric layer includes forming the ferroelectric layer to extend onto a surface of the second dielectric layer.

22. The method of claim 20, further comprising forming a metal fill in a space formed by the second metal layer.

23. The method of claim 20 further comprising forming a third dielectric layer above the second dielectric layer.

24. The method of claim 23 further comprising forming a space in the third dielectric layer and forming a connector metal in the space in the third dielectric layer.

* * * * *